United States Patent
Nogami

(10) Patent No.: US 11,079,688 B2
(45) Date of Patent: Aug. 3, 2021

(54) EXPOSURE APPARATUS AND EXPOSURE METHOD

(71) Applicant: Dexerials Corporation, Tokyo (JP)

(72) Inventor: Asahiko Nogami, Tokyo (JP)

(73) Assignee: Dexerials Corporation, Tokyo (JP)

( * ) Notice: Subject to any disclaimer, the term of this patent is extended or adjusted under 35 U.S.C. 154(b) by 0 days.

(21) Appl. No.: 15/930,443

(22) Filed: May 13, 2020

(65) Prior Publication Data

US 2020/0371446 A1 Nov. 26, 2020

(30) Foreign Application Priority Data

May 21, 2019 (JP) .............................. JP2019-095417

(51) Int. Cl.
*G03F 7/20* (2006.01)
*G03F 7/00* (2006.01)

(52) U.S. Cl.
CPC ........ *G03F 7/70641* (2013.01); *G03F 7/0025* (2013.01); *G03F 7/2053* (2013.01); *G03F 7/70141* (2013.01); *G03F 7/70383* (2013.01)

(58) Field of Classification Search
CPC ...... G03F 7/2053; G03F 7/24; G03F 7/70025; G03F 7/70141; G03F 7/70383; G03F 7/70641

See application file for complete search history.

(56) References Cited

U.S. PATENT DOCUMENTS

| 6,445,667 B1* | 9/2002 | Bernacki | B82Y 10/00 |
| | | | 369/100 |
| 10,578,971 B2* | 3/2020 | Nogami | G03F 7/0002 |
| 2003/0090731 A1* | 5/2003 | Knopf | H04N 1/0671 |
| | | | 358/3.32 |

FOREIGN PATENT DOCUMENTS

JP 2015005678 A 1/2015

* cited by examiner

*Primary Examiner* — Steven Whitesell Gordon
(74) *Attorney, Agent, or Firm* — Kenja IP Law PC

(57) ABSTRACT

An exposure apparatus 10 includes an optical pickup 12 configured to emit laser light and being capable of adjusting the focus of the laser light, a control computing unit 16 configured to adjust the focus of the laser light, an auxiliary stage 21 having the light source unit 12 set thereon, the position of the auxiliary stage 21 being adjustable in the direction toward the master 1, an auxiliary stage control unit 25 configured to control the position of the auxiliary stage 21, wherein the optical pickup 12 includes an object lens 124 configured to direct the laser light to the master 1, a VCM actuator 125 configured to displace the object lens 124 in accordance with a drive current, and the auxiliary stage control unit 25 controls the position of the auxiliary stage 21 in accordance with the drive current for the VCM actuator 125.

6 Claims, 9 Drawing Sheets

EXPOSURE APPARATUS AND EXPOSURE METHOD

CROSS-REFERENCE TO RELATED APPLICATIONS

This application claims priority to Japanese Patent Application No. 2019-095417 filed on May 21, 2019, the entire disclosure of which is incorporated herein by reference.

TECHNICAL FIELD

This disclosure relates to an exposure apparatus and an exposure method by which a master is irradiated with laser light to form a pattern by exposure.

BACKGROUND

One of micro-fabrication techniques is a nanoimprint technique in which a plate-like or a cylindrical (columnar) master on which surface a fine pattern is formed is pressed against a resin sheet for example to transfer the fine pattern on the master to the resin sheet for example.

JP 2015-005678 A (PTL 1) discloses an exposure apparatus for forming a fine pattern on a surface of a master. This exposure apparatus includes spindles provided at both ends of a cylindrical master to hold the master between them, and a light source emitting a laser beam (laser light). In this exposure apparatus, while the master of which surface is coated with thermo-reactive resist or photoreactive resist is rotated, the master is irradiated with (subjected to) a laser beam emitted from the light source in a pattern corresponding to a desired pattern, so that the thermo-reactive resist or photoreactive resist is reacted to form the desired pattern on the surface of the master. The exposure apparatus further includes a beam position deviation control unit controlling a deflection of the laser beam in accordance with a positional deviation between the light source and the master.

CITATION LIST

Patent Literature

PTL 1: JP 2015-005678 A

SUMMARY

In the above-described exposure apparatus, in order to form a pattern by exposure on the master with high accuracy, laser light is required to focus on a master with high accuracy.

FIG. 7 is a diagram illustrating an example configuration of a conventional exposure 100 apparatus performing focus control.

The exposure apparatus 100 depicted in FIG. 7 includes a spindle motor 11, an optical pickup 12, an optical sensor 13, an error computing unit 14, a subtracter 15, a control computing unit 16, an amplification unit 17, and an auxiliary stage 19. The optical pickup 12 and the optical sensor 13 compose an optical head 18. The optical head 18 is set on the auxiliary stage 19.

The optical pickup 12 emits laser light toward the master 1 set on the spindle motor 11. The auxiliary stage 19 having the optical pickup 12 set thereon is movable in the direction of the axis of a cylindrical (or columnar) master 1 set on the spindle motor 11. In other words, the optical pickup 12 is slidable in the direction of the axis of the master 1. By sliding the optical pickup 12 in the direction of the axis of the master 1 while the master 1 is being rotated by the spindle motor 11, it is possible to irradiate the surface of the master 1 with laser light emitted from the optical pickup 12. Thermo-reactive resist or photoreactive resist is formed on the surface of the master 1 by coating, and the master 1 is irradiated with laser light to react a part of the thermo-reactive resist or photoreactive resist that is irradiated with the laser light, thereby forming a pattern on a given area of the surface of the master by exposure.

The optical pickup 12 includes a laser light source 121, a collimator lens 122, a polarizing beam splitter 123, an object lens 124, a voice coil motor (VCM) actuator 125, and a cylindrical lens 126.

The laser light source 121 outputs laser light. The collimator lens 122 makes laser light output from the laser light source 121 into parallel light and outputs the light to the polarizing beam splitter 123.

The polarizing beam splitter 123 passes laser light output from the collimator lens 122 and allows the light to transmit to the object lens 124. The laser light emitted by the optical pickup 12 is reflected by the master 1, and the polarizing beam splitter 123 reflects the light incident through the object lens 124 to direct the light to the cylindrical lens 126.

The object lens 124 concentrates laser light transmitted through the polarizing beam splitter 123 and directs the light toward the master 1. The VCM actuator 125 displaces the object lens 124 in the direction toward the master 1 (forward and backward) in accordance with a drive current (VCM current). When the object lens 124 is displaced, the focus position of laser light emitted from the object lens 124 changes. Thus, the optical pickup 12 can adjust the focus of laser light.

The cylindrical lens 126 concentrates light reflected by the polarizing beam splitter 123 (reflected light from the master 1) on an active area of the optical sensor 13.

The optical sensor 13 is a sensor which receives light from the cylindrical lens 126 (reflected light from the master 1) on the active area and performs output depending on the received light. The optical sensor 13 is for example a four-quadrant photodiode (PD). The optical sensor 13 has an active area divided into four areas (areas A, B, C, and D) as illustrated in FIG. 8, for example.

When laser light illuminating the master 1 focuses on the surface of the master 1, light received by the active area of the optical sensor 13 forms a perfect circle as illustrated in FIG. 9A and is roughly even between the areas A to D. On the other hand, when laser light illuminating the master 1 does not focus on the surface of the master 1 (focus error of laser light occurs), light received by the active area of the optical sensor 13 forms an elliptical shape at an angle as illustrated in FIGS. 9B and 9C. The optical sensor 13 outputs voltages $V_A$ to $V_D$ corresponding to the light illuminating the respective areas A to D to the error computing unit 14.

Referring back to FIG. 7, the error computing unit 14 performs output corresponding to the focus error of the laser light illuminating the master 1. Specifically, the error computing unit 14 calculates a voltage corresponding to the focus error of the laser light illuminating the master 1 (focus error voltage) based on the following formula (1), and outputs the calculated focus error voltage to the subtracter 15.

$$\text{Focus error voltage} = (V_A + V_B) - (V_C + V_D) \tag{1}$$

As described above, when laser light illuminating the master 1 focuses on the surface of the master 1, light received by the active area of the optical sensor 13 forms a perfect circle and evenly illuminates the four areas. Accordingly, the focus error voltage calculated using formula (1) is nearly zero. On the other hand, when laser light illuminating the master 1 does not focus on the surface of the master 1, light received by the active area of the optical sensor 13 forms an elliptical shape at an angle. Accordingly, the focus error voltage calculated using formula (1) is not zeroed out. Thus, a focus error voltage corresponding to the focus error of laser light illuminating the master 1 is output by the error computing unit 14.

The subtracter 15 calculates the difference between a target focus error voltage and the output from the error computing unit 14 (focus error voltage) and outputs the calculated difference to the control computing unit 16. The target focus error voltage is, for example, a value corresponding to the voltage output from the error computing unit 14 with the laser light illuminating the master 1 focusing on the surface of the master 1.

The control computing unit 16 generates a control signal for the VCM actuator 125 for moving the object lens 124 so as to zero out the difference calculated by the subtracter 15 and outputs the signal to the amplification unit 17. The control computing unit 16 generates a control signal for example according to a proportional-integral-differential controller (e.g., PID controller).

The amplification unit 17 amplifies the control signal output from the control computing unit 16 and outputs the signal to the VCM actuator 125 as a drive current. The actuator 125 is then controlled so that the difference calculated by the subtracter 15 is zeroed out. In other words, the control computing unit 16 controls the focus of laser light emitted from the optical pickup 12 by controlling a drive current for the VCM actuator 125. Thus, the exposure apparatus 100 has an autofocus function for adjusting the focus position of laser light to suppress a focus error by the focus servo loop from the subtracter 15 to the error computing unit 14.

In the exposure apparatus 100 depicted in FIG. 7, the focus position of laser light is adjusted by moving the object lens 124 by the VCM actuator 125. Thus, when the inclination of the master 1 is large, for example, the displacement of the VCM actuator 125 is increased accordingly. With an increase in the displacement of the VCM actuator 125, the displacement of the VCM actuator 125 relative to the zero-current (spring-free) position may exceed the focus correction distance range, which is defined as the range of the displacement of the VCM actuator 125 within which a focus can be kept. In this case, if light reflected back from the master 1 is interrupted due to a flaw on the surface of the master 1 or the like, the displacement of the VCM actuator 125 would deviate significantly from the focus position, making laser light to focus on the surface of the master 1 difficult. As a result, an accurate formation of a pattern on the master by exposure may not be achieved.

It could be helpful to address the above problems and provide an exposure apparatus and an exposure method by which a pattern can be on a master by exposure with higher accuracy.

In view of solving the above problems, an exposure apparatus according to this disclosure is an exposure apparatus for forming a pattern by exposure by irradiating a set master with laser light, comprising: a light source unit configured to emit the laser light and being capable of adjusting a focus of the laser light; a control computing unit configured to control the focus of the laser light emitted from light source unit; an auxiliary stage having the light source unit set thereon, a position of the auxiliary stage being adjustable in a direction toward the master; and an auxiliary stage control unit configured to control the position of the auxiliary stage, wherein the light source unit comprises: an object lens configured to direct the laser light to the master; and an actuator configured to displace the object lens in accordance with a drive current, the control computing unit controls the drive current, and the auxiliary stage control unit controls the position of the auxiliary stage in accordance with the drive current for the actuator.

Further, in the exposure apparatus according to this disclosure, preferably, the exposure apparatus further comprises an error computing unit configured to perform an output corresponding to a focus error of the laser light; and an adder configured to add an offset value based on a correction signal generated based on integrated surface profile data, to a target value corresponding to the output from the error computing unit when the laser light focuses on a surface of the master, the integrated surface profile data being indicative of a relative positional relationship between the surface of the master and the light source unit, and being associated with at least one of a roughness of the surface of the master, an inclination of the master, and decentering of the master, wherein the control computing unit controls the drive current for the actuator based on a difference between a sum by the adder and the output from the error computing unit.

Further, in view of solving the above problems, an exposure apparatus according to this disclosure is an exposure apparatus for forming a pattern by exposure by irradiating a set master with laser light, comprising: a light source unit configured to emit the laser light and being capable of adjusting a focus of the laser light; a control computing unit configured to adjust the focus of the laser light emitted from light source unit; an auxiliary stage having the light source unit set thereon, a position of the auxiliary stage being adjustable in a direction toward the master; and an auxiliary stage control unit configured to control the position of the auxiliary stage, wherein the auxiliary stage control unit controls the position of the auxiliary stage based on integrated surface profile data, the integrated surface profile data being indicative of a relative positional relationship between a surface of the master and the light source unit, and being associated with at least one of a roughness of the surface of the master, an inclination of the master, and decentering of the master, which have been measured in advance.

In addition, in the exposure apparatus according to this disclosure, preferably, the exposure apparatus further comprises an error computing unit configured to perform an output corresponding to a focus error of the laser light; and an adder configured to add an offset value based on a correction signal generated based on the integrated surface profile data, to a target value corresponding to the output from the error computing unit when the laser light focuses on a surface of the master, wherein the control computing unit controls the focus of the laser light based on a difference between a sum by the adder and the output from the error computing unit.

Further, in the exposure apparatus of this disclosure, the master is preferably one of a cylindrical master and a columnar master.

Further, in the exposure apparatus of this disclosure, the master is preferably a plate-like master.

Further, in view of solving the above problems, an exposure method according to this disclosure is an exposure method of forming a pattern by exposure on a set master by irradiating the master with laser light using an exposure apparatus which comprises a light source unit configured to emit the laser light and being capable of adjusting a focus of the laser light, wherein the exposure apparatus comprises an auxiliary stage having the light source unit set thereon, a position of the auxiliary stage being adjustable in a direction toward the master, the light source unit comprises: an object lens configured to direct the laser light to the master; and an actuator configured to displace the object lens in accordance with a drive current, and the method comprises controlling the position of the auxiliary stage in accordance with the drive current for the actuator.

Further, in order to solve the above-mentioned problems, an exposure method according to this disclosure is an exposure method of forming a pattern by exposure on a set master by irradiating the master with laser light using an exposure apparatus which comprises a light source unit configured to emit the laser light and being capable of adjusting a focus of the laser light, wherein the exposure apparatus comprises an auxiliary stage having the light source unit set thereon, a position of the auxiliary stage being adjustable in a direction toward the master, the method comprises controlling the position of the auxiliary stage based on integrated surface profile data, the integrated surface profile data being indicative of a relative positional relationship between a surface of the master and the light source unit, and being associated with at least one of a roughness of the surface of the master, an inclination of the master, and decentering of the master, which have been measured in advance.

According to an exposure apparatus and an exposure method of this disclosure, a pattern can be on a master by exposure with higher accuracy.

DETAILED DESCRIPTION

Embodiments of this disclosure will be described below.

First Embodiment

Figure 1:
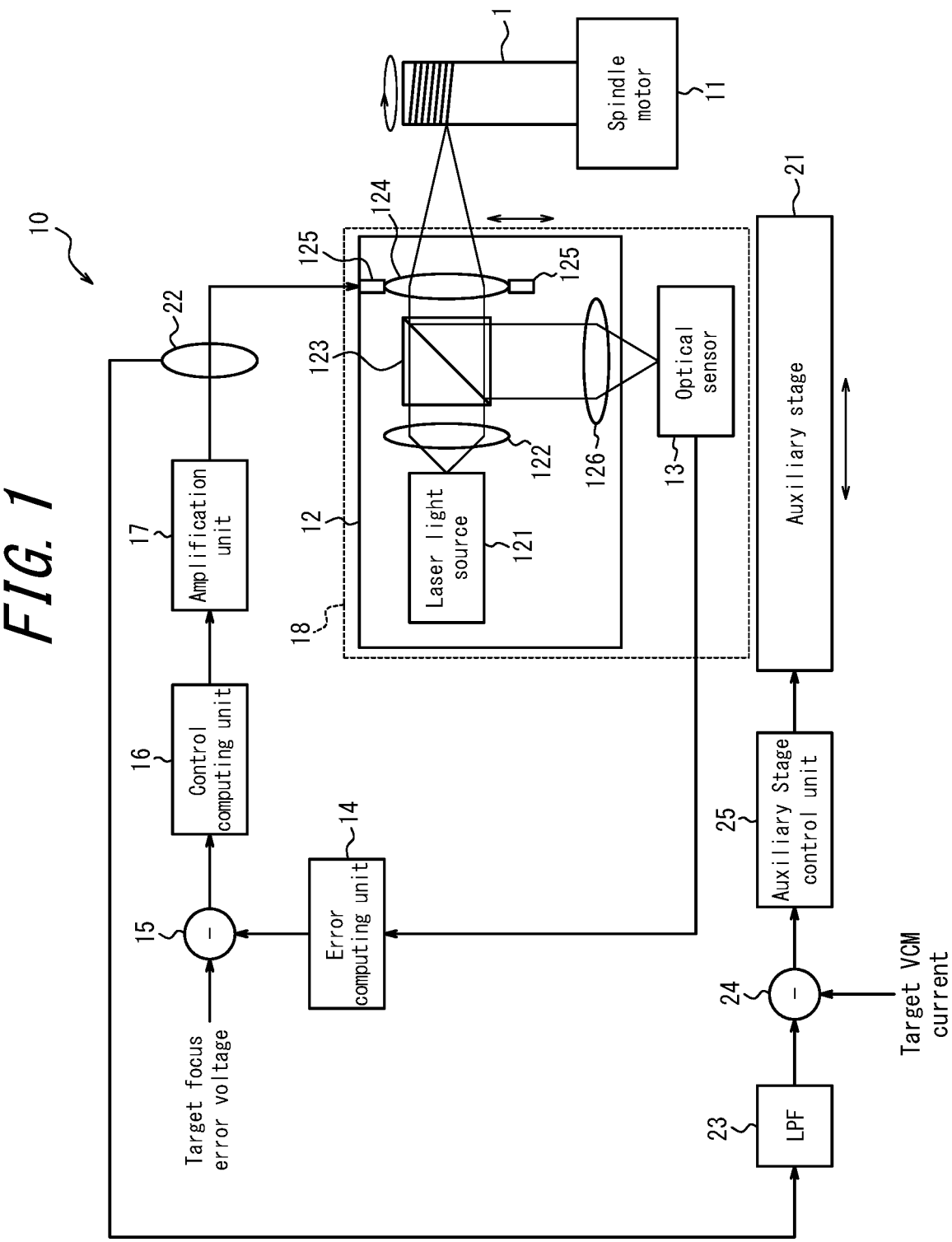
FIG. 1 is a diagram illustrating an example configuration of an exposure apparatus according to a first embodiment of this disclosure.

FIG. 1 is a diagram illustrating an example configuration of an exposure apparatus 10 according to a first embodiment of this disclosure. The exposure apparatus 10 according to this embodiment forms a pattern by exposure by irradiating a master 1 with laser light. The same reference numerals designate like components in FIG. 1 and FIG. 7, and a description of those components will not be repeated.

The exposure apparatus 10 depicted in FIG. 1 includes a spindle motor 11, an optical pickup 12 as a light source unit, an optical sensor 13, an error computing unit 14, a subtracter 15, a control computing unit 16, an amplification unit 17, an auxiliary stage 21, a current detection unit 22, a low pass filter (LPF) 23, a subtracter 24, and an auxiliary stage control unit 25. In other words, the exposure apparatus 10 according to this embodiment differs from the exposure apparatus 100 depicted in FIG. 7 in that the auxiliary stage 19 is replaced with the auxiliary stage 21 and the current detection unit 22, the LPF 23, the subtracter 24, and the auxiliary stage control unit 25 are added. The optical pickup 12 and the optical sensor 13 are separate in FIG. 1; however, the optical sensor 13 may be incorporated in the optical pickup 12.

An optical head 18 composed of the optical pickup 12 and the optical sensor 13 is set on the auxiliary stage 21. The auxiliary stage 21 is movable in the direction of the axis of a cylindrical (or columnar) master 1 set on the spindle motor 11. In other words, the optical pickup 12 is slidable in the direction of the axis of the master 1.

Furthermore, the position of the auxiliary stage 21 is adjustable in the direction toward the master 1 set on the spindle motor 11. The distance between the optical pickup 12 and the master 1 can be adjusted by displacing the auxiliary stage 21 in the direction toward the mounted master 1. This can reduce the displacement of the VCM actuator 125, as will be described in detail later.

The current detection unit 22 detects a drive current (VCM current) for driving the VCM actuator 125, and outputs the detection result to the LPF 23.

The LPF 23 averages drive currents for the VCM actuator 125 detected by the current detection unit 22, and outputs the averaged drive current to the subtracter 24.

The subtracter 24 calculates the difference between the averaged drive current for the VCM actuator 125 output from the LPF 23 and a target VCM current, and outputs the calculation result to the auxiliary stage control unit 25. The target VCM current is a value corresponding to the drive current for the VCM actuator 125 where the displacement of the VCM actuator 125 is zero, for example.

The auxiliary stage control unit 25 controls the position of the auxiliary stage 21 in accordance with the drive current for the VCM actuator 125. Specifically, the auxiliary stage control unit 25 controls the position of the auxiliary stage 21 so that the difference calculated by the subtracter 24 is zeroed out. In other words, the auxiliary stage control unit 25 controls the position of the auxiliary stage 21 so that the displacement of the VCM actuator 125 approaches zero.

Figure 9A:
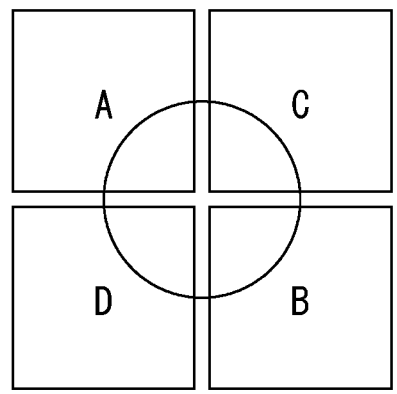
FIG. 9A is a diagram illustrating a state where the active area of the optical sensor receives light when laser light illuminating a master focuses on the surface of the master.
Figure 9B:
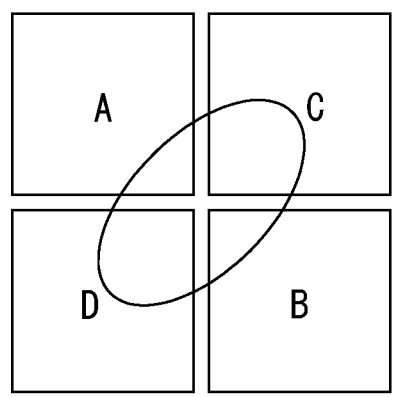
FIG. 9B is a diagram illustrating an example of a state where the active area of the optical sensor receives light when laser light illuminating a master does not focus on the surface of the master.
Figure 9C:
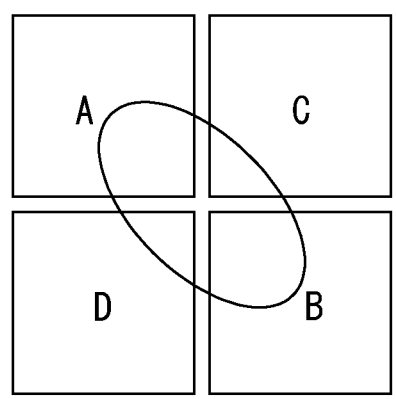
FIG. 9C is a diagram illustrating another example of a state where the active area of the optical sensor receives light when laser light illuminating a master does not focus on the surface of the master.

As described with reference to FIG. 9A to 9C, how light is received by the active area of the optical sensor 13 varies depending on whether or not laser light emitted from the optical pickup 12 focuses on the surface of the master 1. Specifically, when laser light emitted from the optical pickup 12 focuses on the surface of the master 1, light received by the active area of the optical sensor 13 forms a perfect circle as illustrated in FIG. 9A and is roughly even between the areas A to D. On the other hand, when laser light emitted from the optical pickup 12 does not focus on the surface of the master 1, light received by the active area of the optical sensor 13 forms an elliptical shape at an angle as illustrated in FIGS. 9B and 9C.

Hereinafter, waveforms of an error signal (ERR signal) represented by the following equation (2) and a sum signal (SUM signal) represented by the following equation (3) will be discussed.

$$ERR\ \text{signal} = (V_A + V_B) - (V_C + V_D) \tag{2}$$

$$SUM\ \text{signal} = V_A + V_B + V_C + V_D \tag{3}$$

Figure 2:
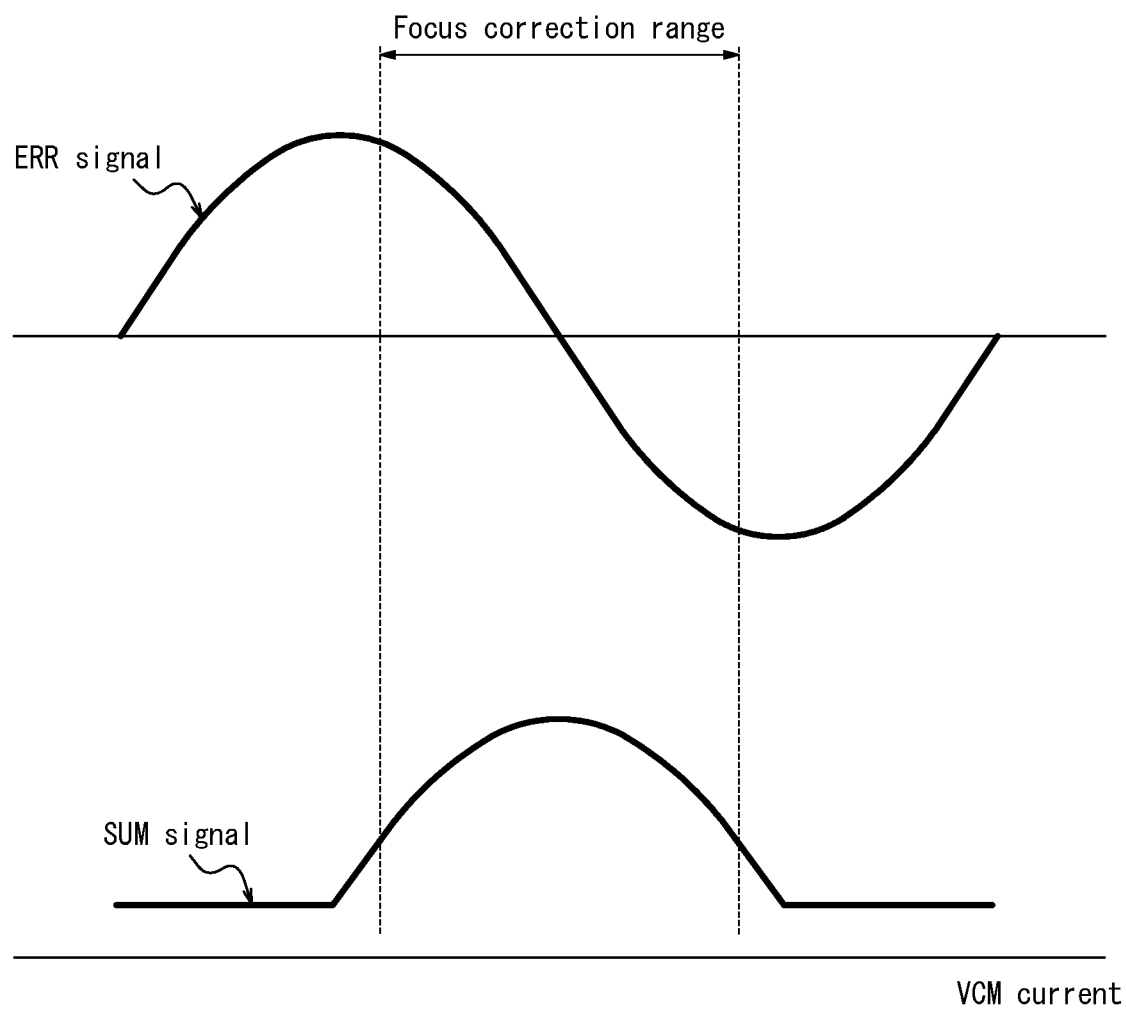
FIG. 2 is a diagram illustrating waveforms of ERR and SUM signals.

With a change in a drive current for the VCM actuator 125, the ERR and SUM signals change as in the respective waveforms illustrated in FIG. 2. In cases where the focus of laser light is controlled by displacing the object lens 124 by the VCM actuator 125, a range (focus correction range) within which the focus can be kept responsive to a variation in the distance between the master 1 and the optical pickup 12 is limited. As depicted in FIG. 2, the focus correction range is generally a range from the point where the VCM current is a slightly greater than the local maximum point on the sine-shaped ERR signal curve and to the point where the VCM current is slightly smaller than the local minimum point on the sine-shaped ERR signal curve. In other words, the focus correction range is a range that is centered around the point where the sine-shaped ERR signal curve becomes zero and has a width slightly smaller than a half of the full width of the ERR signal. The focus correction range in terms of a displacement of the VCM actuator 125, for example, is the range of about 20 μm, in other words, the range of about 10 μm centered around the point where the displacement of the VCM actuator 125 becomes zero.

As described above, the auxiliary stage control unit 25 performs control so that the deviation between the drive current for the VCM actuator 125 and a target VCM current is zeroed out. The target VCM current corresponds to the drive current for the VCM actuator 125 where the displacement of the VCM actuator 125 is zero. In other words, the auxiliary stage control unit 25 controls the position of the auxiliary stage 21 so that the displacement of the VCM actuator 125 is zeroed out. This makes it highly probable that the displacement of the VCM actuator 125 falls within the focus correction range.

As described above with reference to FIG. 7, laser light emitted from the optical pickup 12 can be made to focus on the master 1 only by controlling the displacement of the object lens 124. Depending on the inclination of the master 1 or the like, however, laser light emitted from the optical pickup 12 would focus on the master 1 in a state where the displacement of the VCM actuator 125 relative to the zero current (spring-free) position is out of the focus correction range. In such a case, if the distance between the master 1 and the optical pickup 12 instantaneously fluctuates due to a flaw on the surface of the master 1 or the like, the displacement of the VCM actuator 125 would be out of the focus correction range and the focus would not be kept.

On the other hand, in this embodiment, the auxiliary stage control unit 25 controls the position of the auxiliary stage 21 so that the displacement of the VCM actuator 125 is zeroed out (so that the displacement of the VCM actuator 125 falls within the focus correction range). Thus, even when the distance between the master 1 and the optical pickup 12 instantaneously fluctuates due to a flaw on the surface of the master 1 or the like, focus control by the object lens 124 can keep the laser light to focus on the master 1. Accordingly, a pattern can be formed on the master 1 with higher accuracy.

It is to be noted that the displacement of the VCM actuator 125 increases with an increase in the drive current. Thus, laser light emitted from the optical pickup 12 can be made to focus on the master 1 by increasing the drive current if required. Note that an increased drive current increases heat generation and may shorten the lifetime of the VCM actuator 125. In addition, an increased drive current reduces the linearity between the drive current and the displacement, which reduces the autofocus loop gain. Ideally, the displacement of the VCM actuator 125 is desirably limited within a range from the point of the center of the spring-free position (i.e., the position where the displacement is zero) to about a quarter of the stroke range of the VCM actuator 125.

Figure 3:
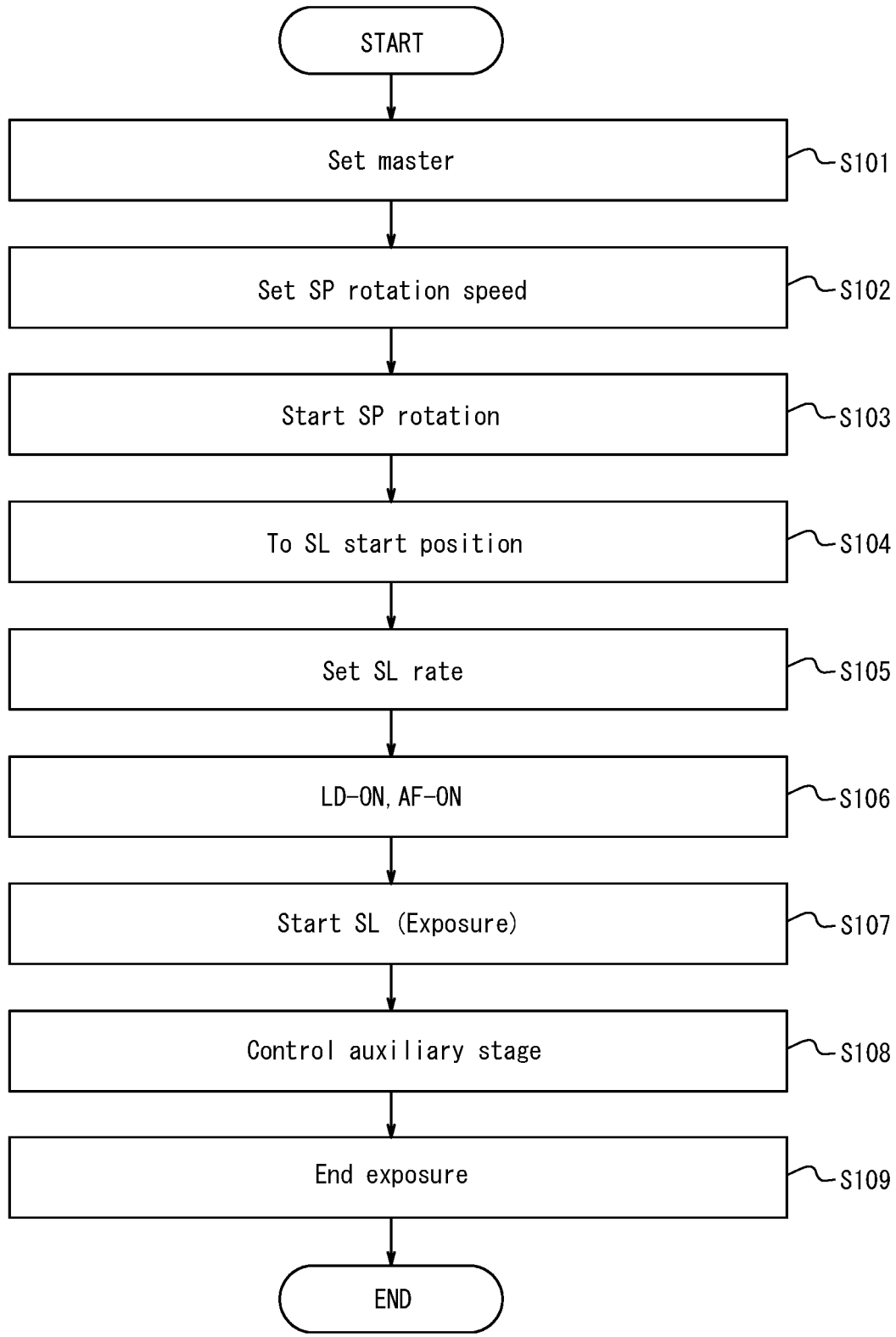
FIG. 3 is a flowchart illustrating an exposure method by the exposure apparatus depicted in FIG. 1.

Next, an exposure method by the exposure apparatus 10 of this embodiment will be described with reference to the flowchart given in FIG. 3.

First, a cylindrical master 1 is set on the spindle motor 11 (Step S101). Next, the rotation speed of the spindle motor 11 (SP rotation speed) is set (Step S102), and the spindle motor 11 is rotated in accordance with the setting (Step S103).

Further, the optical pickup 12 is moved to a starting position (SL start position) from which sliding is started in the direction of the axis of the cylindrical master 1 (Step S104). Then, the sliding rate (SL rate) of the optical pickup 12 in the direction of the axis of the master 1 is set (Step S105).

Subsequently, the laser light source 121 is turned on (LD-ON) to output laser light, and the autofocus function of the exposure apparatus 10 (autofocus function by the autofocus servo loop from the subtracter 15 to the error computing unit 14) is turned on (AF-ON) (Step S106).

The optical pickup 12 then starts to slide in accordance with the setting of the SL speed, and exposure of the master 1 is started (Step S107).

The auxiliary stage control unit 25 controls the position of the auxiliary stage 21 in accordance with the drive current for the VCM actuator 125 (Step S108). In other words, focus control by the displacement of the object lens 124 and control of the position of the auxiliary stage 21 are performed in accordance with irradiation of the master 1 with laser light. After the completion of the exposure of the master 1 with light (Step S109), the exposure apparatus 10 terminates operation.

As described above, in this embodiment, the exposure apparatus 10 includes the optical pickup 12 configured to emit laser light and being capable of adjusting the focus of the laser light, the control computing unit 16 configured to control the focus of the laser light emitted from the optical pickup 12, the auxiliary stage 21 having the optical pickup 12 set thereon, the position of the auxiliary stage 21 being adjustable in the direction toward the master 1 set on the spindle motor 11, and the auxiliary stage control unit 25 configured to control the position of the auxiliary stage 21. The optical pickup 12 includes the object lens 124 configured to direct the laser light to the master 1, and the VCM actuator 125 configured to displace the object lens 124 in accordance with a drive current. The auxiliary stage control unit 25 controls the position of the auxiliary stage 21 in accordance with the drive current for the VCM actuator 125.

The drive current for the VCM actuator 125 is associated with the distance between the master 1 and the optical pickup 12. Accordingly, by controlling the position of the auxiliary stage 21 in the direction toward the master 1 in accordance with the distance between the master 1 and the optical pickup 12, the displacement of the VCM actuator 125 can be reduced. Thus, even when the distance between the master 1 and the optical pickup 12 instantaneously fluctuates due to a flaw on the surface of the master 1 or the like, laser light emitted from the optical pickup 12 can be kept to focus on the master 1 by displacing the object lens 124 by the VCM actuator 125. As a result, a pattern can be formed on the master 1 with higher accuracy.

In addition, by controlling the position of the auxiliary stage 21 so that the displacement of the VCM actuator 125 is reduced, occurrence of an excessive tension and heat generation in the VCM actuator 125 can be suppressed, thereby achieving power saving and long lifetime. It is to be noted that since a generally-used stage is employed as the auxiliary stage 21 on which the optical head 18 composed of the optical pickup 12 and the optical sensor 13 is set, a large increase in the cost is not incurred.

Second Embodiment

Figure 4:
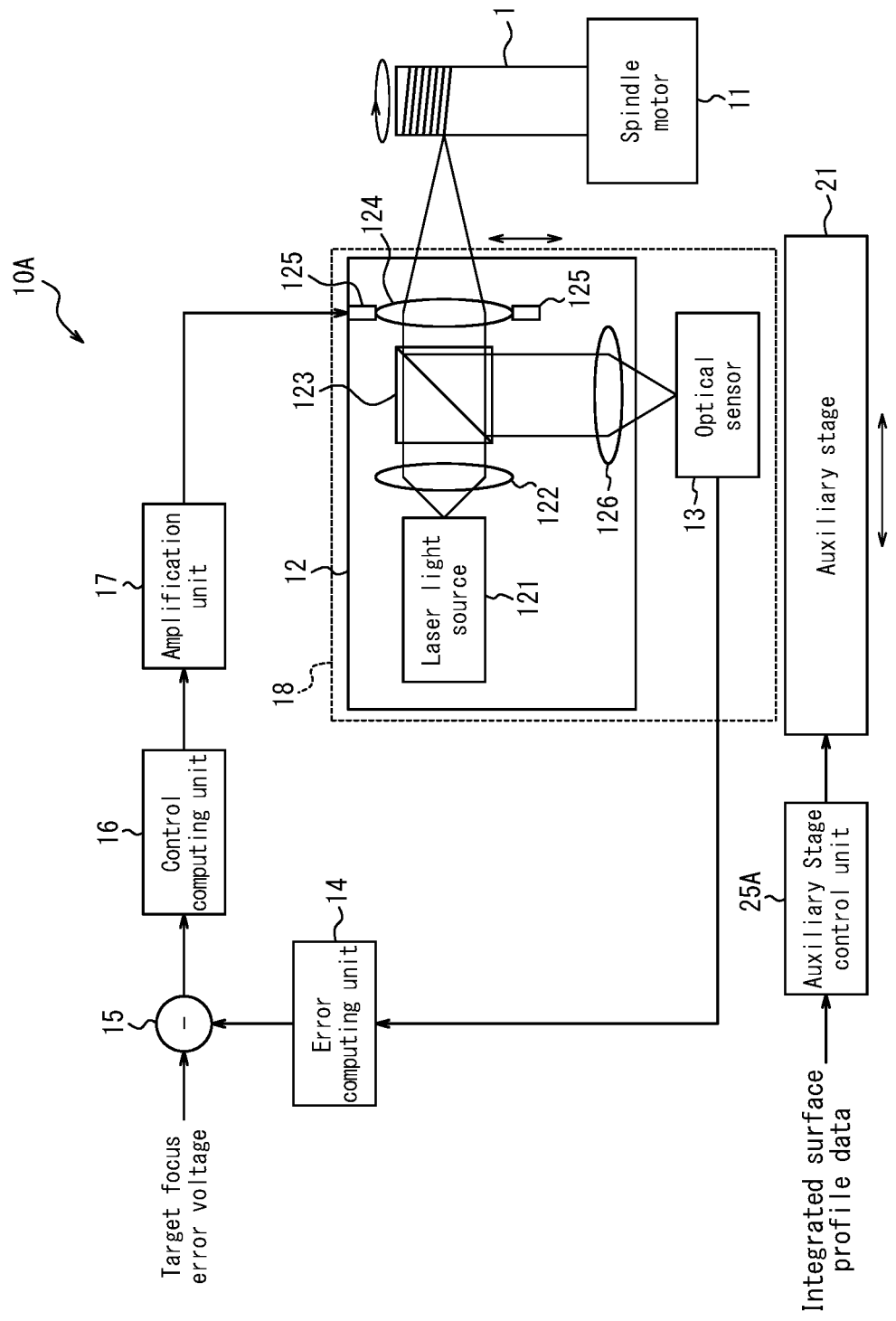
FIG. 4 is a diagram illustrating an example configuration of an exposure apparatus according to a second embodiment of this disclosure.

FIG. 4 is a diagram illustrating an example configuration of an exposure apparatus 10A according to a second embodiment of this disclosure. The same reference numerals designate like components in FIG. 4 and FIG. 1, and a description of those components will not be repeated.

The exposure apparatus 10A depicted in FIG. 4 includes a spindle motor 11, an optical pickup 12, an optical sensor 13, an error computing unit 14, a subtracter 15, a control computing unit 16, an amplification unit 17, an auxiliary stage 21, and an auxiliary stage control unit 25A. In other words, the exposure apparatus 10A according to this embodiment differs from the exposure apparatus 10 depicted in FIG. 1 in that the current detection unit 22, the LPF 23, and the subtracter 24 are eliminated and the auxiliary stage control unit 25 is replaced with the auxiliary stage control unit 25A.

The auxiliary stage control unit 25A controls the position of the auxiliary stage 21 in the direction toward a master 1 so that the displacement of the VCM actuator 125 approaches zero based on integrated surface profile data that has been measured in advance. Here, the integrated surface profile data is data that is indicative of the relative positional relationship between the surface of the master 1 and the optical pickup 12, and is associated with at least one of the roughness (irregularities) of the surface of the master 1, the inclination of the set master 1, and the decentering of the master 1.

The integrated surface profile data is acquired by measuring at least one of the roughness of the surface of the master 1 set on the spindle motor 11, the inclination of the set master 1, and the decentering of the master 1, in advance. The integrated surface profile data is measured, as follows, for example.

First, a master 1 is set on the spindle motor 11. Next, the rotation speed of the spindle motor 11 is set, and the spindle motor 11 rotates in accordance with the setting.

Further, the optical pickup 12 is moved to the starting position to slide, and the sliding rate of the optical pickup 12 is set.

Next, the laser light source 121 is turned on to output laser light, and the autofocus function is turned on. Further, a measurement interval for the measurement of the focus error voltage or VCM current is set. The sliding of the optical pickup 12 is then started, the focus error voltage or VCM current is measured at the measurement interval set, and measurements of the integrated surface profile data are started. For example, since a loop transfer function of the autofocus loop from the subtracter 15 to the error computing unit 14 is known, integrated surface profile data can be acquired from the focus error voltage. After the completion of scanning of the entire or a part (predetermined area) of the master 1 with laser light, the measurements of the integrated surface profile data are terminated.

Note that the integrated surface profile data may be acquired using a laser displacement meter. In general, an exposure apparatus is often provided with a decentering and inclination adjustment mechanism for reducing the decentering and inclination of a master 1 to be set on the spindle motor 11. The integrated surface profile data may be acquired from control data for the decentering and inclination adjustment mechanism.

As described above, in this embodiment, the exposure apparatus 10A includes the optical pickup 12 configured to emit laser light and being capable of adjusting the focus of the laser light, the control computing unit 16 configured to adjust the focus of the laser light emitted from the optical pickup 12, the auxiliary stage 21 having the optical pickup 12 set thereon, the position of the auxiliary stage 21 being adjustable in the direction toward the master 1, and the auxiliary stage control unit 25A configured to control the position of the auxiliary stage 21. The auxiliary stage control unit 25A controls the position of the auxiliary stage 21 based on integrated surface profile data indicative of a relative positional relationship between the surface of the master 1 and the optical pickup 12, the integrated surface profile data being associated with at least one of the roughness of the surface of the master 1, the inclination of the master 1, and the decentering of the master 1, which have been measured in advance.

By controlling the position of the auxiliary stage 21 in the direction toward the master 1 based on the integrated surface profile data, the displacement of the VCM actuator 125 can be reduced. Thus, even when the distance between the master 1 and the optical pickup 12 instantaneously fluctuates due to a flaw on the surface of the master 1 or the like, laser light emitted from the optical pickup 12 can be kept to focus on the master 1 by displacing the object lens 124 by the VCM actuator 125. As a result, a pattern can be formed on the master 1 with higher accuracy.

Third Embodiment

Figure 5:
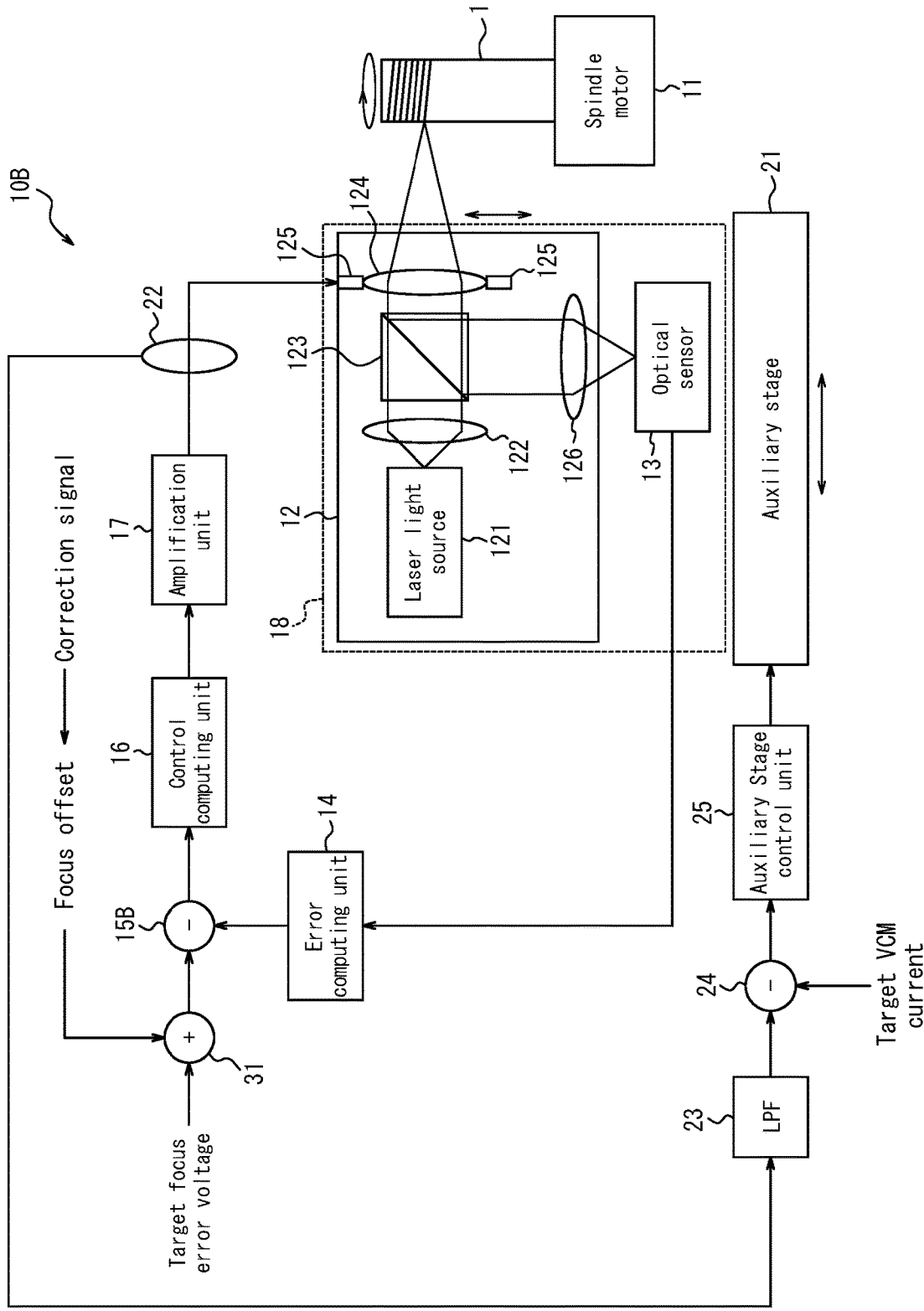
FIG. 5 is a diagram illustrating an example configuration of an exposure apparatus according to a third embodiment of this disclosure.

FIG. 5 is a diagram illustrating an example configuration of an exposure apparatus 10B according to a third embodiment of this disclosure. The same reference numerals designate like components in FIG. 5 and FIG. 1, and a description of those components will not be repeated.

Figure 7:
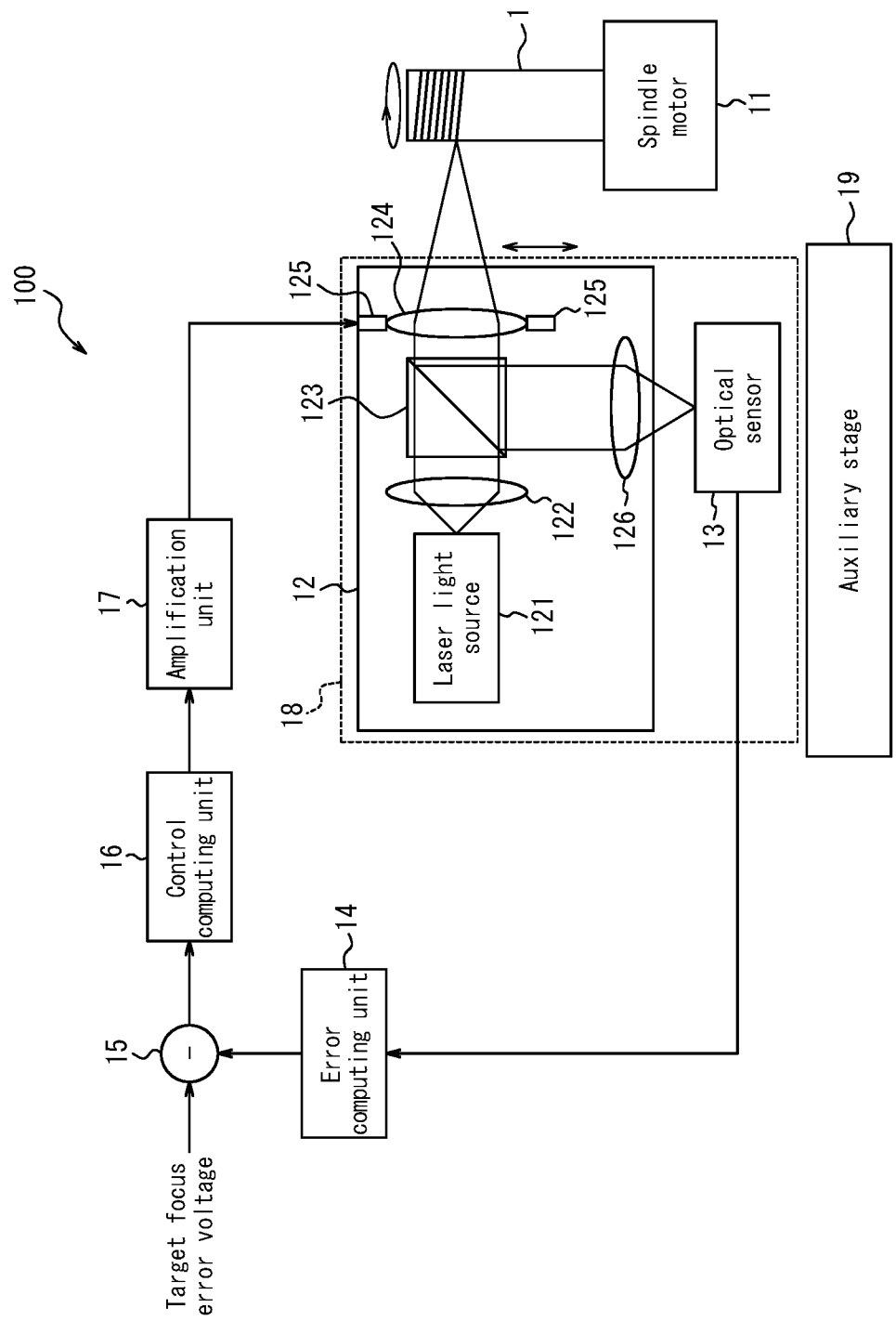
FIG. 7 is a diagram illustrating a configuration example of a conventional exposure apparatus.
Figure 8:
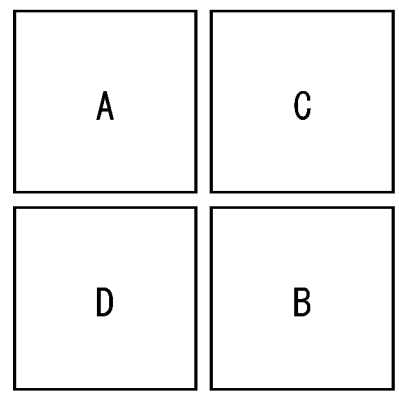
FIG. 8 is a diagram illustrating an example of an active area of an optical sensor.

In the exposure apparatus 10 depicted in FIG. 7, a focus error cannot completely be removed, and an error (residual error) of approximately one out of a loop transfer function (gain) for the whole focus servo loop from the subtracter 15 to the error computing unit 14 would remain. Particularly, when a pattern is formed on a set master 1 by exposure, if the relative positional relationship between the optical pickup 12 and the surface of the master 1 is significantly varied by the influence of the roughness (irregularities) of the surface of the master 1, the inclination of the master 1, the decentering of the master 1, etc., the residual error would be large. A large residual error makes it impossible to form a pattern on the master 1 by exposure with high accuracy. The exposure apparatus 10B according to this embodiment is directed to further improve the accuracy of a pattern formation on the master 1 by exposure by reducing the residual error.

The exposure apparatus 10B depicted in FIG. 5 includes a spindle motor 11, an optical pickup 12, an optical sensor 13, an error calculating unit 14, a subtracter 15B, a control calculating unit 16, an amplifying unit 17, an auxiliary stage 21, a current detection unit 22, an LPF 23, a subtracter 24, an auxiliary stage control unit 25, and an adder 31. In other words, the exposure apparatus 10B according to this embodiment is different from the exposure apparatus 10 depicted in FIG. 1 in that the adder 31 is added and the subtracter 15 is replaced with the subtracter 15B.

The adder 31 receives an input of a focus offset (offset value) to be added to a target focus error voltage, in accordance with the position on the surface of the master 1 to be exposed to light. The focus offset is generated in accordance with a correction signal generated based on integrated surface profile data. The adder 31 adds the input focus offset to the target focus error voltage, and outputs the sum to the subtracter 15B.

The subtracter 15B calculates the difference between the output from the adder 31 and the focus error voltage output by the error computing unit 14, and outputs the calculation result to the control computing unit 16. Subsequently, as with the exposure apparatus 10 depicted in FIG. 1, the VCM actuator 125 is controlled so that the difference calculated by the subtracter 15B is zeroed out. As described above, in the exposure apparatus 100 depicted in FIG. 7, although the control was performed so that the difference between the target focus error voltage and the focus error voltage is zeroed out, a focus error of approximately one out of a loop transfer function of the focus servo loop would be left. On the other hand, in the exposure apparatus 10B of this embodiment, focus control is performed after adding the target focus error voltage based on the integrated surface profile data, to a focus offset for correcting the target focus error voltage so that a focus error left after the focus servo loop is zeroed out, so that a focus error can be suppressed with higher accuracy, and as a result, a pattern can be formed on the master 1 by exposure with higher accuracy.

Next, a method of generating the correction signal will be described.

First, as described in the second embodiment, a focus error voltage is measured at a predetermined sampling rate while the master 1 is being scanned with laser light. Next, a correction signal (table or function) for adjusting the focus offset so that the focus error voltage is zeroed out is generated by calculations based on the measured focus error voltage and a known loop transfer function.

The method of generating the correction signal is not limited to the method using a focus error voltage; alternatively, a correction signal can be generated for example using a drive current for the VCM actuator 125 (VCM current). Hereinafter a method of generating a correction signal using a VCM current will be described.

First, a VCM current is measured at a predetermined sampling rate while the master 1 is being scanned with laser light. As described above, the VCM actuator 125 is operated so as to suppress a focus error using the autofocus function. Accordingly, the VCM current indicates the displacement of the object lens 124, in other words, the relative positional relationship between the surface of the master 1 and the optical pickup 12. Next, a correction signal for adjusting the focus offset so that the focus error voltage is zeroed out is generated by calculations based on the measured VCM current and the known loop transfer function.

When the focus error voltage is low and the quantization error is large, if a correction signal is generated based on the focus error voltage, the error would be large. In this case, the displacement of the object lens 124 is calculated from the VCM current; a residual error is estimated from the displacement, the focus servo transfer function, and properties of the optical sensor 13; and a correction signal is generated such that the estimated residual error is compensated. Thus, a highly accurate correction signal can be generated.

Alternatively, the focus error voltage and the VCM current may be measured and a correction signal may be generated from the measurement results.

As described above, the optical sensor 13 may be incorporated in the optical pickup 12. In this case, the focus error voltage and the VCM current can be detected by the optical pickup 12. Accordingly, the focus error voltage and the VCM current is measured using the optical pickup 12 and integrated surface profile data can be acquired from the measurement results.

Alternatively, the integrated surface profile data of the master 1 may be measured using a displacement meter and a correction signal may be generated from the measurement result. In this case, a displacement meter such as a laser displacement sensor, a displacement laser interferometer, or a capacitive displacement sensor is used to measure the integrated surface profile data of the master 1. Subsequently, a correction signal is generated based on the results of the measurement using a displacement meter and the known focus servo transfer function.

As described above, in this embodiment, the exposure apparatus 10B includes the adder 31 configured to add an offset value based on a correction signal generated based on integrated surface profile data to a target focus error voltage, the subtracter 15B configured to calculate the difference between a sum by the adder 31 and an output from the error computing unit 14, and the control computing unit 16 configured to control the focus of the laser light based on the difference calculated by the subtracter 15B.

By adding the offset value based on the correction signal generated based on the integrated profile data to the target focus error voltage, a focus error left after operating only a focus servo loop can be suppressed, and a focus error can be suppressed with higher accuracy. As a result, a pattern can be formed on the master 1 by light exposure with higher accuracy. Since focus control can be performed with higher accuracy, the polishing accuracy required for the master 1 can be reduced, so that significant increase in cost can be avoided.

Fourth Embodiment

Figure 6:
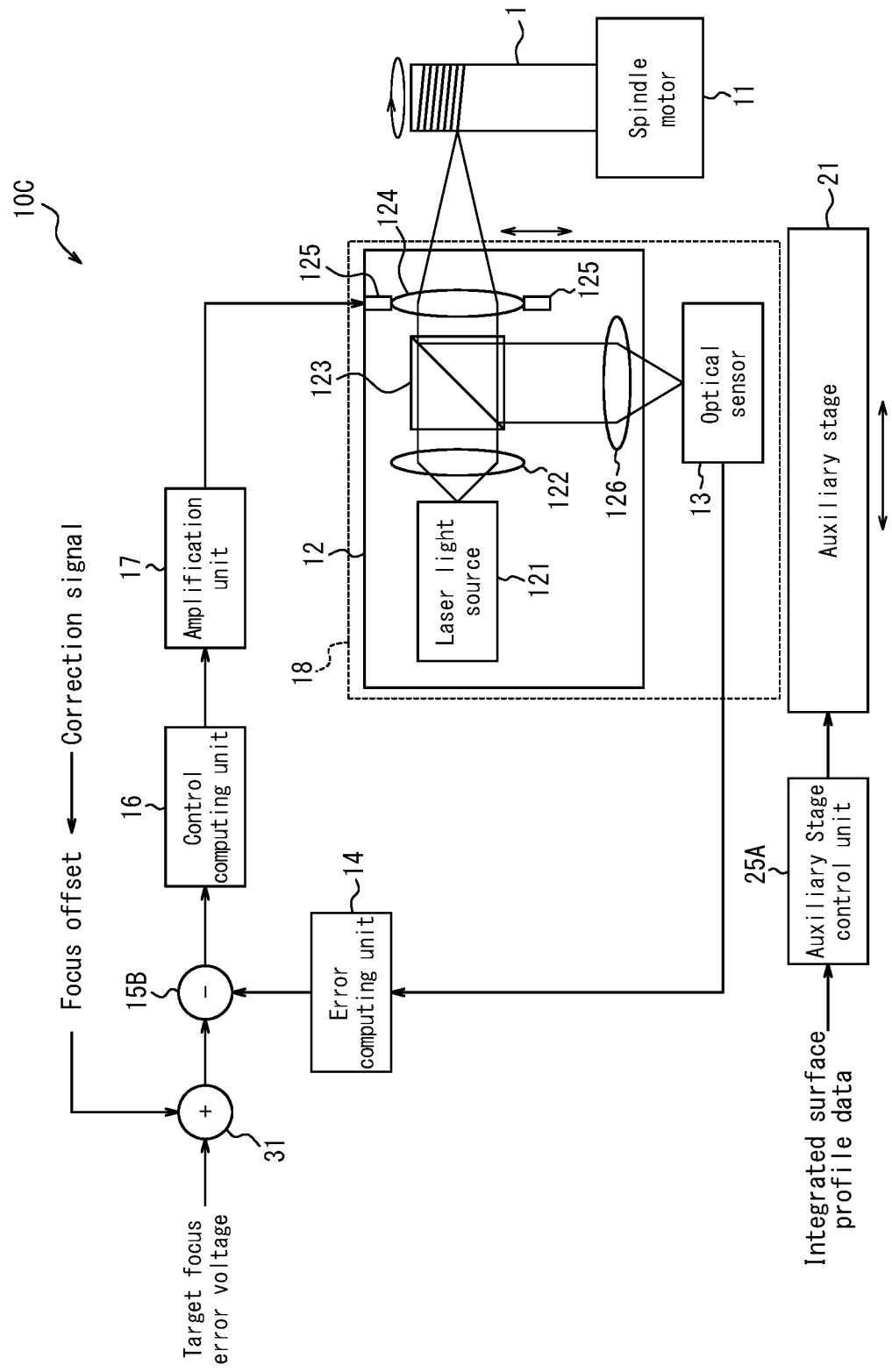
FIG. 6 is a diagram illustrating an example configuration of an exposure apparatus according to a fourth embodiment of this disclosure.

FIG. 6 is a diagram illustrating an example configuration of an exposure apparatus 10C according to a fourth embodiment of this disclosure. The same reference numerals designate like components in FIG. 6 and FIGS. 4 and 5, and a description of those components will not be repeated.

The exposure apparatus 10C depicted in FIG. 6 includes a spindle motor 11, an optical pickup 12, an optical sensor 13, an error computing unit 14, a subtracter 15B, a control computing unit 16, an amplification unit 17, an auxiliary stage 21, an auxiliary stage control unit 25A, and an adder 31. In other words, the exposure apparatus 10C according to this embodiment is different from the exposure apparatus 10A depicted in FIG. 4 in that the adder 31 is added and the subtracter 15 is replaced with the subtracter 15B. Since the operations of the adder 31 and the subtracter 15B are the same as those in the third embodiment, the description thereof will be omitted.

As described above, even in cases where the position of the auxiliary stage 21 is controlled based on integrated surface profile data, by adding an offset value based on a correction signal generated based on integrated profile data to a target focus error voltage, the remaining error can be reduced and a pattern can be formed on the master 1 by exposure with even higher accuracy.

EXAMPLES

Next, this disclosure will be described more specifically with reference to examples and comparative examples; yet this disclosure is not limited to the examples described below.

(Masters)

First, as masters for forming a pattern by exposure by irradiating the masters with laser light, cylindrical masters made of glass were prepared. Each of the master has a radius of 140 mm and a length of 500 mm. The variation in the thicknesses of the masters was 500 µm. The surface profile error of the cylindrical masters was 40 µmp-p.

Example 1

In this example, a pattern was formed by exposure on a prepared master using the exposure apparatus 10 described with reference to FIG. 1. The rotation speed of the spindle motor 11 during exposure was set to 900 rpm. The sliding rate of the optical pickup in the direction of the axis of the cylindrical master was set to 3 µm/sec. As a laser light source, a laser diode emitting laser light of a wavelength of 405 nm was used. A VCM actuator had a sensitivity of 4 mm/A and a displacement stroke of ±400 µm.

Example 2

In this example, a pattern was formed by exposure on a prepared master using the exposure apparatus 10A described with reference to FIG. 4 under the same conditions as in Example 1.

Example 3

In this example, a pattern was formed by exposure on a prepared master using the exposure apparatus 10B described with reference to FIG. 5 under the same conditions as in Example 1.

Example 4

In this example, a pattern was formed by exposure on a prepared master using the exposure apparatus 10C described with reference to FIG. 6 under the same conditions as in Example 1.

Comparative Example 1

In this comparative example, a pattern was formed by exposure on a prepared master using the exposure apparatus 100 described with reference to FIG. 7 under the same conditions as in Example 1.

Comparative Example 2

In this comparative example, a pattern was formed by exposure on a prepared master by performing only focus control using a focus offset without controlling the position of the auxiliary stage.

Evaluation results of the pattern formations by exposure in the above-described Examples 1-4 and Comparative Examples 1 and 2 will be described.

Evaluations on heat generation and focus performances of the VCM actuators of the pattern formations by exposure in Examples 1-4 and Comparative Examples 1 and 2 are summarized in Table 1.

TABLE 1

|  | Heat generation | Focus performance |
| --- | --- | --- |
| Example 1 | Good | Good in low range |
| Example 2 | Good | Good in low range |
| Example 3 | Good | Good in low and high ranges |
| Example 4 | Good | Good in low and high ranges |
| Comparative Example 1 | Poor | Good in low range |
| Comparative Example 2 | Poor | Good in low and high ranges |

As summarized in Table 1, with regard to the heat generation in the VCM actuators, results were good in Examples 1-4, whereas good results were not obtained in Comparative Examples 1 and 2. In Table 1, when the heat generation amount was equal to or lower than a predetermined threshold (e.g., from 50 mW to 100 mW), the result was evaluated as good.

In Examples 1-4, an average current of VCM current was almost 0 A. The coil resistor R of the VCM actuator was approximately 10Ω, in these examples. Since the AC effective current I of the VCM current is about 3.5 mA, the heat generation amount was about $I^2 \times R = (3.5 \text{ mW})^2 \times 10 = 0.1225$ mW in Examples 1-4.

On the other hand, in Comparative Example 1, the AC effective current I of the VCM current was 200 mA at maximum, for example. Accordingly, the heat generation amount was about $I^2 \times R = (200 \text{ mW})^2 \times 10 = 400$ mW in Comparative Example 1.

As described above, the heat generation in the VCM actuators was reduced in Examples 1-4 as compared to Comparative Examples 1 and 2.

Further, as summarized in Table 1, the focus performances were good for irregularities in the low range in Examples 1 and 2. Further, the focus performances were good for irregularities in the low and high ranges in Examples 3 and 4. In Comparative Example 1, the focus performance was good for irregularities in the low range. In Comparative Example 2, the focus performance was good for irregularities in the low and high ranges.

It is to be noted that the irregularities in the low range refer to irregularities having a cycle corresponding to a frequency of approximately from DC to 1 Hz. In addition, the irregularities in the high range refer to irregularities having a cycle corresponding to a frequency of approximately several hertz or higher. For example, the frequency is 5 Hz for a rotational speed of the spindle motor 11 of 300 rpm, and is 15 Hz or higher for a rotational speed of the spindle motor 11 of 900 rpm.

In Comparative Examples 1 and 2, only the position of the object lens 124 was controlled. Accordingly, assuming the stroke of the VCM actuator of 400 µm and the focus correction range of 20 µm, for example, the focus correction range encompassed only about 20 µm/400 µm×100=5% of the displacement of the VCM actuator. On the other hand, in Examples 1-4, since the position of the auxiliary stage 21 was controlled so that the displacement of the VCM actuator approached zero, the focus correction range encompassed approximately 100% of the displacement of the VCM actuator.

The above first to fourth embodiments have been descried with reference to examples where the master 1 has a cylindrical shape; however, this disclosure is not limited to this shape. The master 1 may be shaped for example like a plate.

It should be noted that while this disclosure has been described in conjunction with the drawings and the embodiments, those skilled in the art can easily implement various changes and modifications based on this disclosure. It should therefore be noted that the changes or modifications are included in the scope of this disclosure. Functions included in blocks can be rearranged in a manner no logical inconsistency arises; for example, a plurality of blocks may be combined into one or may be divided.

REFERENCE SIGNS LIST 10, 10A, 10B, 10C, 100 Exposure apparatus
11 Spindle motor
12 Optical pickup
121 Laser light source
122 Collimator lens
123 Polarizing beam splitter
124 Object lens
125 Actuator
126 Cylindrical lens
13 Optical sensor
14 Error computing unit
15, 15B Subtracter
16 Control computing unit
17 Amplification unit
18 Optical head
19, 21 Auxiliary stage
22 Current detection unit
23 LPF
24 Subtracter
25, 25A Auxiliary Stage control unit
31 Adder

The invention claimed is:

1. An exposure apparatus for forming a pattern by exposure by irradiating a set master with laser light, comprising:
a light source unit configured to emit the laser light and being capable of adjusting a focus of the laser light;
a control computing unit configured to control the focus of the laser light emitted from light source unit;
an auxiliary stage having the light source unit set thereon, a position of the auxiliary stage being adjustable in a direction toward the master;
an auxiliary stage control unit configured to control the position of the auxiliary stage;
an error computing unit configured to perform an output corresponding to a focus error of the laser light; and
an adder configured to add an offset value based on a correction signal generated based on integrated surface profile data, to a target value corresponding to the output from the error computing unit when the laser light focuses on a surface of the master, the integrated surface profile data being indicative of a relative positional relationship between the surface of the master and the light source unit, and being associated with at least one of a roughness of the surface of the master, an inclination of the master, and decentering of the master,
wherein the light source unit comprises:
an object lens configured to direct the laser light to the master; and
an actuator configured to displace the object lens in accordance with a drive current,
the control computing unit controls the drive current for the actuator based on a difference between a sum by the adder and the output from the error computing unit, and
the auxiliary stage control unit controls the position of the auxiliary stage in accordance with the drive current for the actuator.

2. The exposure apparatus according to claim 1, wherein the master is one of a cylindrical master and a columnar master.

3. The exposure apparatus according to claim 1, wherein the master is a plate-like master.

4. An exposure apparatus for forming a pattern by exposure by irradiating a set master with laser light, comprising:
a light source unit configured to emit the laser light and being capable of adjusting a focus of the laser light;
a control computing unit configured to adjust the focus of the laser light emitted from light source unit;
an auxiliary stage having the light source unit set thereon, a position of the auxiliary stage being adjustable in a direction toward the master;
an auxiliary stage control unit configured to control the position of the auxiliary stage,
an error computing unit configured to perform an output corresponding to a focus error of the laser light; and
an adder configured to add an offset value based on a correction signal generated based on integrated surface profile data, to a target value corresponding to the output from the error computing unit when the laser light focuses on a surface of the master, the integrated surface profile data being indicative of a relative positional relationship between a surface of the master and the light source unit, and being associated with at least one of a roughness of the surface of the master, an inclination of the master, and decentering of the master,
wherein the auxiliary stage control unit controls the position of the auxiliary stage based on integrated surface profile data, and
the control computing unit controls the focus of the laser light based on a difference between a sum by the adder and the output from the error computing unit.

5. An exposure method of forming a pattern by exposure on a set master by irradiating the master with laser light using an exposure apparatus which comprises a light source unit configured to emit the laser light and being capable of adjusting a focus of the laser light,
wherein the exposure apparatus comprises an auxiliary stage having the light source unit set thereon, a position of the auxiliary stage being adjustable in a direction toward the master,
the light source unit comprises:
an object lens configured to direct the laser light to the master; and
an actuator configured to displace the object lens in accordance with a drive current, and
the method comprises:
performing an output corresponding to a focus error of the laser light;
adding an offset value based on a correction signal generated based on integrated surface profile data, to a target value corresponding to the output when the laser light focuses on a surface of the master, the integrated surface profile data being indicative of a relative positional relationship between the surface of the master and the light source unit, and being associated with at least one of a roughness of the surface of the master, an inclination of the master, and decentering of the master;

controlling the drive current for the actuator based on a difference between a sum of the offset value and the target value and the output; and controlling the position of the auxiliary stage in accordance with the drive current for the actuator.

6. An exposure method of forming a pattern by exposure on a set master by irradiating the master with laser light using an exposure apparatus which comprises a light source unit configured to emit the laser light and being capable of adjusting a focus of the laser light, wherein the exposure apparatus comprises an auxiliary stage having the light source unit set thereon, a position of the auxiliary stage being adjustable in a direction toward the master, the method comprises:

controlling the position of the auxiliary stage based on integrated surface profile data, the integrated surface profile data being indicative of a relative positional relationship between a surface of the master and the light source unit, and being associated with at least one of a roughness of the surface of the master, an inclination of the master, and decentering of the master, which have been measured in advance;

performing an output corresponding to a focus error of the laser light;

adding an offset value based on a correction signal generated based on the integrated surface profile data to a target value corresponding to the output when the laser light focuses on a surface of the master; and controlling the focus of the laser light based on a difference between a sum of the offset value and the target value and the output.

* * * * *